United States Patent [19]

Kohno et al.

[11] Patent Number: 5,597,494
[45] Date of Patent: Jan. 28, 1997

[54] METHOD OF MANUFACTURING MULTILAYER CERAMIC ELECTRONIC COMPONENT

[75] Inventors: Yoshiaki Kohno; Tatsuya Suzuki, both of Nagaokakyo, Japan

[73] Assignee: Murata Manufacturing Co., Ltd., Japan

[21] Appl. No.: 382,136

[22] Filed: Feb. 1, 1995

Related U.S. Application Data

[63] Continuation-in-part of Ser. No. 216,617, Mar. 23, 1994.

[30] Foreign Application Priority Data

Mar. 26, 1993 [JP] Japan .................................. 5-67795

[51] Int. Cl.$^6$ ..................................................... B44C 1/22
[52] U.S. Cl. .................. 216/6; 216/13; 216/20; 216/35; 29/25.42; 428/209; 361/313
[58] Field of Search ...................... 216/6, 13, 17, 216/20, 33, 35; 156/630.1, 656.1; 428/209, 457, 461, 515, 901; 361/312, 313, 321; 29/25.42

[56] References Cited

U.S. PATENT DOCUMENTS 4,685,197  8/1987  Tigelaar et al. ..................... 216/6 X
5,179,773  1/1993  Monsees et al. .................... 29/25.42
5,197,170  3/1993  Senda et al. ....................... 216/6 X

FOREIGN PATENT DOCUMENTS 3414808  4/1984  Germany.
 254269  4/1986  Germany.
2224311  9/1990  Japan.

*Primary Examiner*—William Powell
*Attorney, Agent, or Firm*—Ostrolenk, Faber, Gerb & Soffen, LLP

[57] ABSTRACT

Disclosed herein is a method of manufacturing a multilayer ceramic electronic component by forming external electrodes on a pair of opposite side surfaces of a sintered body (1) obtained by sintering a laminate prepared by stacking a plurality of ceramic green sheets through internal electrodes to be electrically connected with prescribed ones of the internal electrodes. The method of manufacturing a multilayer ceramic electronic component comprises a step of forming the internal electrodes on single major surfaces of the ceramic green sheets by a thin film forming method, a step of electrochemically etching the opposite side surfaces (1$a'$, 1$b$) of the sintered body (1) for forming gap regions between the internal electrodes and those of the external electrodes which must not be electrically connected with the internal electrodes and a step of filling up clearance portions (A) defined by dissolution/removing of the internal electrodes by the etching with an insulating material.

15 Claims, 7 Drawing Sheets

METHOD OF MANUFACTURING MULTILAYER CERAMIC ELECTRONIC COMPONENT

This is a Continuation-in-Part of U.S. patent application Ser. No. 08/216,617 filed Mar. 23, 1994.

BACKGROUND OF THE INVENTION

1. Field of the Invention

The present invention relates to a method of manufacturing a multilayer ceramic electronic component comprising ceramic layers which are stacked with each other through internal electrodes, and more particularly, it relates to a method of manufacturing a multilayer ceramic electronic component including improved steps of forming the internal electrodes and ensuring insulation between the internal electrodes and external electrodes.

2. Description of the Background Art

It is well known that a multilayer ceramic electronic component such as a multilayer capacitor or a multilayer piezoelectric actuator comprising a plurality of ceramic layers which are stacked with each other through internal electrodes is applied to various uses. A method of manufacturing such a multilayer ceramic electronic component is now described with reference to a multilayer capacitor.

In a conventional method of manufacturing a general multilayer capacitor, conductive paste is printed on one major surface of each of a plurality of rectangular ceramic green sheets to extend from a first edge toward a second edge but not to reach the second edge, with a gap region. Then, the plurality of ceramic green sheets having the conductive paste layers printed thereon are stacked so that the gap regions are alternately positioned along the thicknesses, to obtain a laminate. Thereafter the laminate is compressed along its thickness and fired to obtain a sintered body, so that external electrodes are formed on a pair of opposite side surfaces of the sintered body respectively. Thus obtained is a multilayer capacitor, in which the internal electrodes are alternately electrically connected to the external electrodes provided on the pair of opposite side surfaces along the thicknesses.

In the aforementioned method, however, it is difficult to accurately control the gap regions between the internal electrodes and those of the external electrodes which must not be electrically connected with the internal electrodes, since the internal electrodes are formed by printing the conductive paste on the ceramic green sheets. Consequently, it is inevitably necessary to increase the widths of the gap regions, i.e., the distances between the internal electrodes and those of the external electrodes provided on opposite sides. Thus, this method has such problems that (1) distortion stress tends to concentrate in forward ends of the external electrodes, and (2) it is impossible to further miniaturize the multilayer capacitor.

On the other hand, Japanese Patent Laying-Open No. 2-224311 (1990) proposes a method of electrochemically etching a sintered body for partially dissolving/removing the same thereby forming gap regions, so that widths of the gap regions can be controlled in high accuracy. According to this method, conductive paste is printed on the overall surface of each of a plurality of ceramic green sheets to form an internal electrode, and the plurality of ceramic green sheets provided with the conductive paste layers are stacked with each other to obtain a laminate. Then the laminate is sintered, and thereafter a pair of opposite side surfaces of the sintered body as obtained are electrochemically etched with respect to the internal electrodes which must not be finally exposed on the opposite side surfaces, so that portions exposing the internal electrodes and those close thereto are dissolved/removed to define clearances. The clearances are filled up with an insulating material such as synthetic resin, and thereafter external electrodes are formed on the pair of opposite side surfaces respectively.

According to the method disclosed in Japanese Patent Laying-Open No. 2-224311 (1990), it is possible to narrow the aforementioned gap regions since the internal electrodes which are exposed on the pair of opposite side surfaces of the sintered body are electrochemically etched to define clearances as hereinabove described.

In this method, however, the electrodes are formed by printing the conductive paste and baking the conductive paste in firing of the ceramic green sheets. Thus, the electrode material is so insufficient in continuity that edges of the forward ends of the internal electrodes facing the gap regions are not necessarily sufficient in smoothness. When the widths of the gap regions are narrowed in the sintered body, therefore, electric field concentration easily takes place in parts of the insulating material which is filled up in the clearances, to cause dielectric breakdown.

SUMMARY OF THE INVENTION

An object of the present invention is to provide a method of manufacturing a multilayer ceramic electronic component, which can form narrow gap regions in forward ends of internal electrodes in high accuracy and improve smoothness of edges of forward ends of the internal electrodes facing the gap regions.

In the method of manufacturing a multilayer ceramic electronic component according to the present invention, ceramic green sheets and metal films formed by a thin film forming method are first prepared. A laminate is then prepared which has a portion in which the ceramic green sheets and internal electrodes consisting of the metal films are alternately stacked and has at least a pair of opposite side surfaces to which the internal electrodes are exposed. In this case, a well-known thin film forming method such as vacuum deposition, sputtering, plating or a combination thereof is employed as the aforementioned thin film forming method.

The step of preparing the above described laminate can be carried out in various methods. For example, the laminate can be obtained by forming metal films on ceramic green sheets by a thin film forming method and stacking a plurality of ceramic green sheets having metal films formed thereon. Further, in preparing the ceramic green sheets and the metal films, the ceramic green sheet may be formed on a first supporting film by the Doctor blade method or the like, while the metal film may be formed on a second supporting film by the thin film forming method. In the case, the ceramic green sheet on the first supporting film and the metal film on the second supporting film are alternately transferred from the first and second supporting films, thereby to make it possible to obtain the above described laminate.

Then, electrochemical etching is carried out on the pair of opposite side surfaces of the laminate with respect to those of the internal electrodes which must not finally be exposed on the opposite side surfaces, to dissolve/remove the exposed portions of the internal electrodes and portions close thereto. Thereafter the dissolved/removed portions of the internal electrodes are filled up with an insulating material. Then, external electrodes are formed on the pair of opposite side surfaces of the laminate respectively.

The laminate may be sintered either before or after the aforementioned etching.

According to the present invention, the internal electrodes are defined by the metal films which are formed by a thin film forming method. Thus, the electrode material is densely and correctly applied as compared with a case of forming internal electrodes by printing conductive paste, whereby the electrode material is remarkably improved in continuity. When clearances are defined by electrochemical etching, therefore, edge portions of the internal electrodes facing the clearances are improved in smoothness.

According to the inventive method of manufacturing a multilayer ceramic electronic component, the internal electrodes are formed by a thin film forming method, whereby the edges of the internal electrodes facing gap regions are improved in smoothness. When the gap regions are narrowed to obtain a smaller multilayer ceramic electronic component, therefore, electric field concentration hardly takes place in parts of the insulating material which is filled up in the clearances defined by etching.

Further, the internal electrodes are formed by a thin film forming method, whereby it is possible to reduce labor required for the step of forming the internal electrodes on the ceramic green sheets and in stacking of the ceramic green sheets provided with the internal electrodes as compared with a method of patterning and printing conductive paste.

Further, sizes of the gap regions are decided by electrochemically etching parts of the internal electrodes for defining clearances, whereby the widths of the gap regions can be easily narrowed and controlled in high accuracy.

According to the present invention, therefore, dielectric breakdown hardly takes place also when the gap regions are reduced in width, whereby it is possible to provide a smaller multilayer ceramic electronic component which is excellent in reliability.

Further, in accordance to another aspect of the present invention, there is provided a monolithic ceramic electric component comprising a sintered body wherein ceramic layers and inner electrodes each made of a metal layer formed by a thin film forming method are alternatively stacked; and first and second outer electrodes formed on side surfaces of the sintered body and electrically connected to predetermined inner electrodes. With the monolithic ceramic electric component, an insulating layer is formed between an inner end of the inner electrode connected with the first or second outer electrode and the second or first outer electrode, and the edge of the inner end of the inner electrode exists in a range of ±5 μm in the direction of the inner electrode surface from an intended or designed location.

With the monolithic component, the concentration of an electric field is liable to occur at the inner end of the inner electrode in case of the irregularity over 5 μm existing at the edge, and thus the insulative break-down between the inner end of the inner electrode and the outer electrode connected to a different electric potential from the inner electrode is liable to occur. With the present invention, therefore, the edge of the inner end of the inner electrode is as a whole within a range of ±5 μm from the designed location, and thus the occurrence of such a insulative break-down is reliably inhibited.

Accordingly, even if a small monolithic component having the small gap region is manufactured, a monolithic component having a small size and not easily broke-down can be provided.

Suitably, the distance between the inner end of the inner electrode and the outer electrode formed on the opposite side is within a range of 5 μm to 70 μm. the reason of this is that if the distance is shorter than 5 μm, the inner end of the inner electrode becomes to be close to the opposite outer electrode, so that the electric insulating property cannot be maintained, even if the concentration of the electric field does not occur. Further, the reason of the distance being shorter than 70 μm is that if the same is longer than 70 μm, the miniatualization of the monolithic component becomes to be difficult.

In accordance with a particular aspect of the present inventive monolithic component, a plurality of the inner electrodes are alternatively connected in the thickness direction with the first or second outer electrode, and the ceramic layer is formed by the piezoelectric ceramics. Accordingly, there can be provided a monolithic piezoelectric actuator not being readily broke-down and having an excellent reliability.

Further, in accordance with another particular aspect of the present invention, the ceramic layer is made of dielectric ceramics, so that there can be provided a monolithic capacitor wherein the concentration of the electric field is not liable to occur, and the same being excellent in reliability and having a large capacitance.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 11A is a sectional view showing a state where a ceramic green sheet is formed on a first supporting film, and FIG. 11B is a sectional view showing a state where metal films are formed on a second supporting film.

DESCRIPTION OF THE PREFERRED EMBODIMENTS

With reference to the drawings, non-restrictive Examples are now described to clarify the present invention.

FIRST EXAMPLE

Material powder mainly composed of $Pb(Mg_{1/3}Nb_{2/3})O_3$ was dispersed in a solvent with an organic binder, to obtain ceramic slurry. This slurry was employed to prepare a plurality of ceramic green sheets having uniform thicknesses of 10 μm.

Internal electrodes mainly composed of silver were formed on single major surfaces of the aforementioned ceramic green sheets by vapor deposition, and thereafter the ceramic green sheets were punched into 60 mm by 40 mm in size.

The plurality of ceramic green sheets which were prepared in the aforementioned manner with the internal electrodes provided on the single major surfaces were stacked with other ceramic green sheets provided with no internal electrodes, compressed along the thicknesses thereof and thereafter fired at a temperature of 900° C., to obtain a sintered body.

The sintered body as obtained was cut along its thickness by a diamond cutter, to obtain a sintered body of 3 mm by 3 mm having a rectangular plane shape.

Figure 1A:
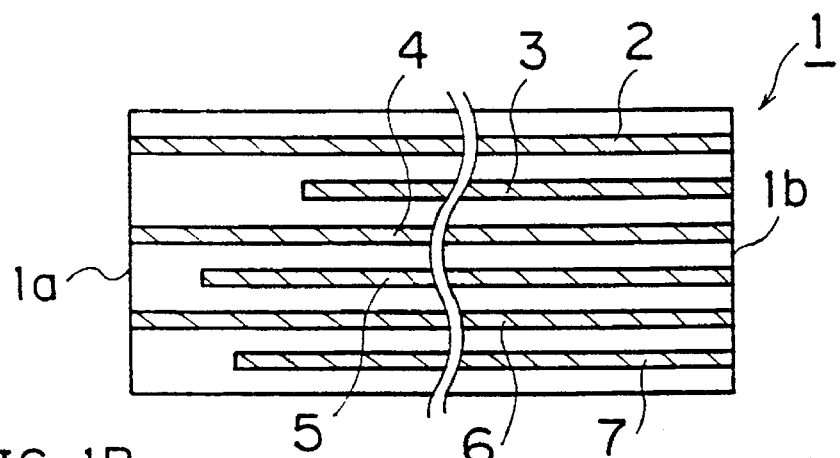
FIGS. 1A and 1B are sectional views showing a sintered body prepared in fist Example of the present invention and the sintered body provided with a common electrode on a first side surface respectively.

FIG. 1A is a sectional view showing the sintered body obtained in the aforementioned manner. In this sintered body 1, a plurality of internal electrodes 2 to 7 were arranged to overlap with each other along thicknesses thereof through ceramic layers. These internal electrodes 2 to 7 were formed by vapor deposition, as hereinabove described.

Figure 1B:
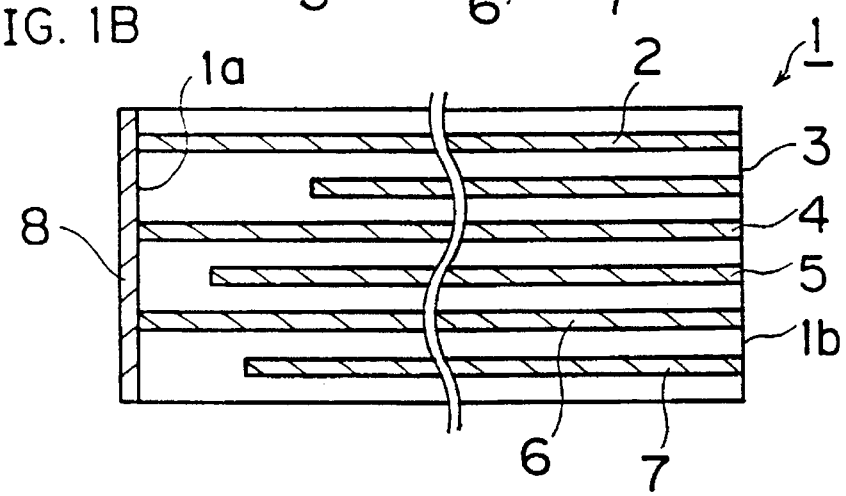

Then, a common electrode 8 was formed to cover an end surface 1a of the sintered body 1, as shown in FIG. 1B.

Figure 2:
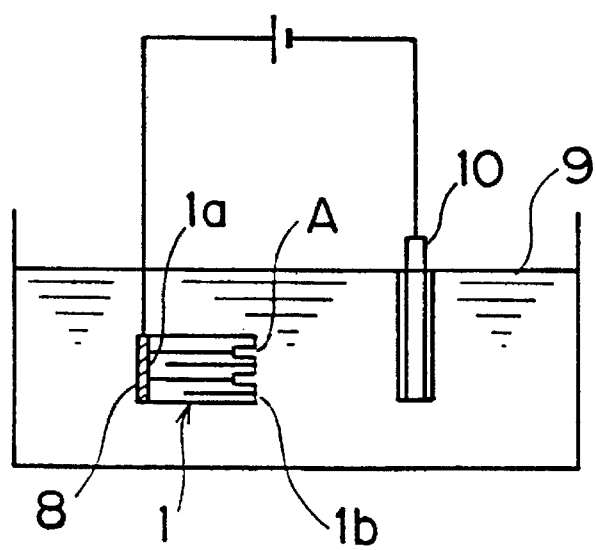
FIG. 2 is a schematic side elevational view showing a method of electrochemically etching edges of internal electrodes and portions close thereto.
Figure 3A:
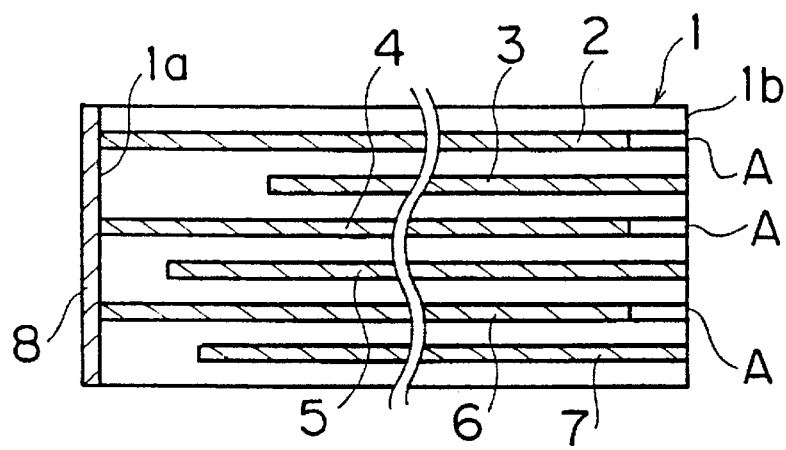
FIGS. 3A and 3B are sectional views showing the sintered body provided with clearances by etching and that provided with insulating layers through an insulating material filled up in the clearances in first Example respectively.

Then, the sintered body 1 was dipped in a silver nitrate aqueous solution 9 as shown in FIG. 2, and a potential difference of 1.0 V was supplied between a silver electrode 10 which was also dipped in the silver nitrate aqueous solution 9 and the aforementioned common electrode 8, to dissolve/remove portions of the internal electrodes 2, 4 and 6, which were electrically connected with the common electrode 8, exposed on another side surface 1b of the sintered body 1 shown in FIG. 1 and portions close thereto, among the internal electrodes 2 to 7 which were exposed on the side surface 1b. FIG. 3A shows the sintered body 1, in which the internal electrodes 2, 4 and 6 were partially dissolved/removed. As shown in FIG. 3A, clearances A were defined between the internal electrodes 2, 4 and 6 and the side surface 1b. The widths of the clearances A, i.e., the distances between forward ends of the internal electrodes 2, 4 and 6 and the side surface 1b, were 15 μm.

Figure 3B:
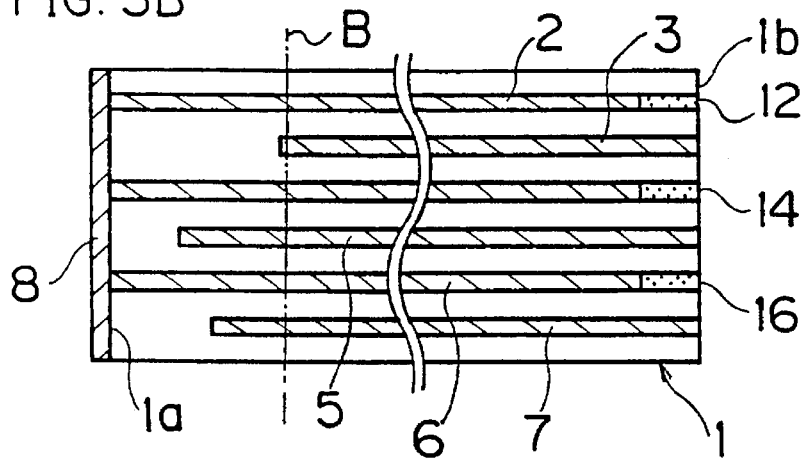

The locations of the inner edge of the inner electrodes 2, 4 and 6 were as a whole within a range of ±3 μm from the designed value (linear shape) in the electrode surface direction (the left to right direction in FIGS. 3A and 3B).

Then, the clearances A were filled up with fine powder of Pb—Si—Al glass, serving as an insulating material, by electrophoresis and heat treatment was carried out at a temperature of 850° C., to form insulating layers 12, 14 and 16 shown in FIG. 3B.

Figure 4:
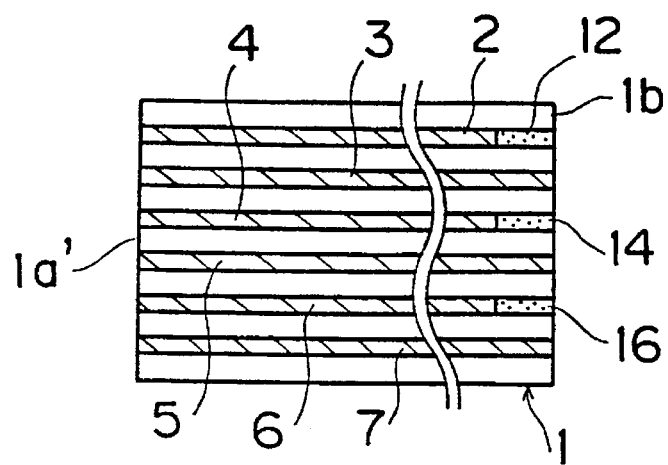
FIG. 4 is a sectional view showing the sintered body provided with the insulating layers, whose other end surface was polished to expose the internal electrodes.

Further, the sintered body 1 was polished from the side provided with the common electrode 8 to a portion shown by the two-dot chain line in FIG. 3B, to expose the internal electrodes 2 to 7 on a newly formed side surface 1a', as shown in FIG. 4.

Figure 5:
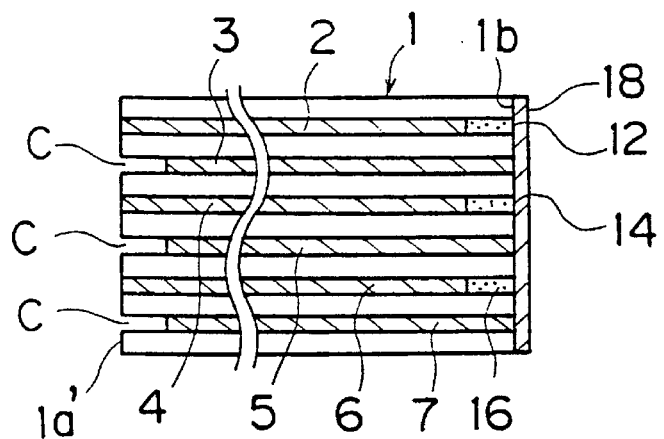
FIG. 5 is a sectional view showing the sintered body whose second side surface was electrochemically etched to define clearances.

Then, another common electrode 18 was formed on the side surface 1b of the sintered body 1 as shown in FIG. 5, and the sintered body 1 was again dipped in the silver nitrate aqueous solution and electrochemically etched similarly to the above to remove portions of the internal electrodes 3, 5 and 7, which were electrically connected with the common electrode 18, exposed on the side surface 1a' and portions close thereto, thereby defining clearances C.

Figure 6:
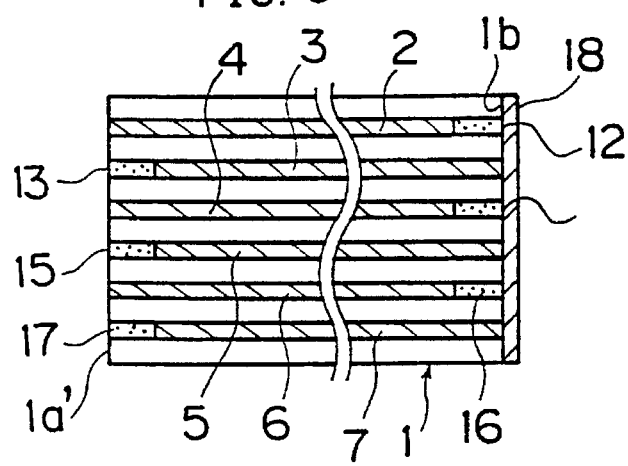
FIG. 6 is a sectional view showing the sintered body having the clearances which were filled up with an insulating material.

Further, insulating layers 13, 15 and 17 were formed in the clearances C similarly to the insulating layers 12, 14 and 16 formed in the clearances A (see FIG. 6).

Figure 7:
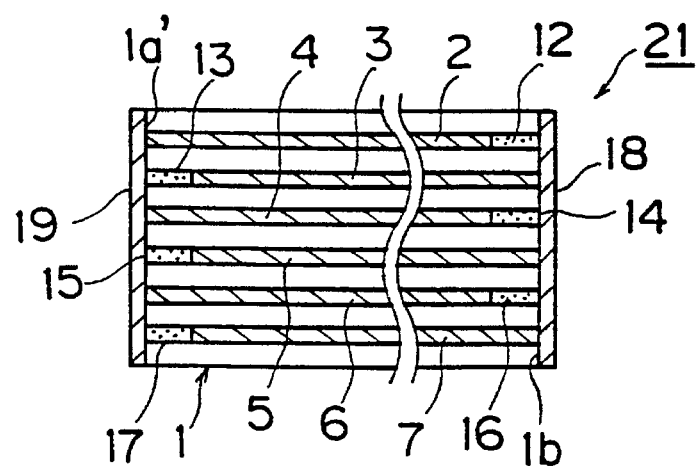
FIG. 7 is a sectional view showing a multilayer piezoelectric actuator obtained according to first Example.
Figure 8:
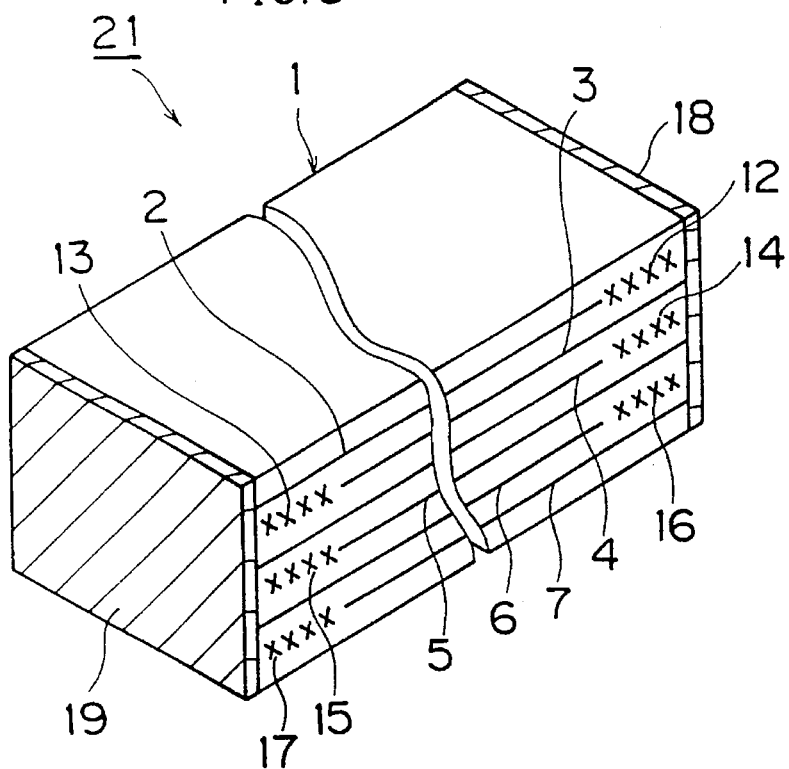
FIG. 8 is a perspective view showing the multilayer piezoelectric actuator obtained according to first Example.

Then, still another common electrode 19 was formed on the side surface 1a' of the sintered body 1, to obtain a multilayer piezoelectric actuator 21 shown in FIGS. 7 and 8. In this multilayer piezoelectric actuator 21, the common electrodes 18 and 19 formed external electrodes to be electrically connected to the exterior respectively.

Figure 9A:
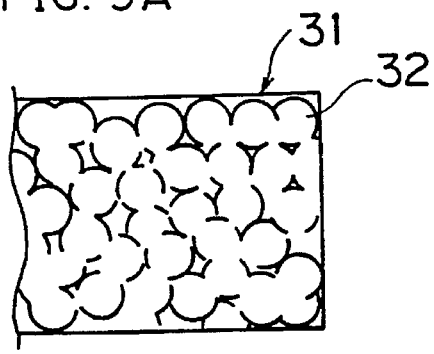
FIGS. 9A and 9B are partially fragmented plan views showing an internal electrode formed according to a conventional method and the internal electrode having an end and a portion close thereto which were electrochemically dissolved/removed respectively.
Figure 9B:
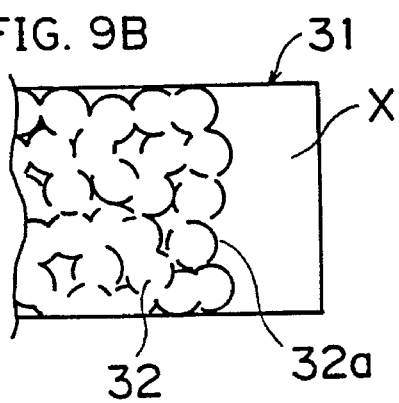

With reference to FIGS. 9A, 9B, 10A and 10B, description is now made on smoothness of an edge of an internal electrode in the manufacturing method of this Example and a state of an edge of an internal electrode formed by a conventional method of printing conductive paste. According to the conventional method, an electrode material is insufficient in continuity as shown in FIG. 9A in a plan sectional view, even if an internal electrode 32 is entirely formed in a certain vertical position in a sintered body 31. When the sintered body 31 is etched to form a gap region X as shown in FIG. 9B, therefore, an edge 32a of the internal electrode 32 has no sufficient continuity.

Figure 10A:
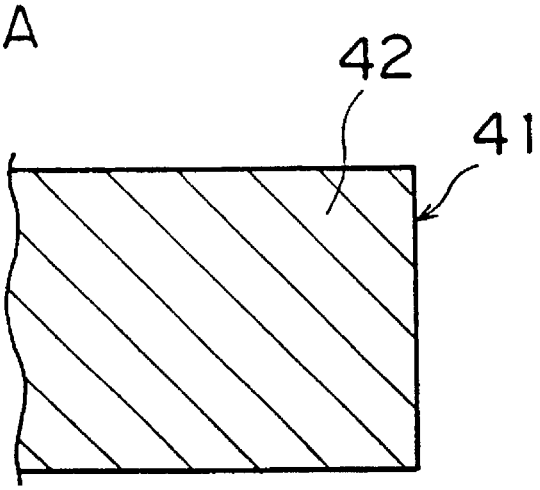
FIGS. 10A and 10B are partially fragmented plan views showing an internal electrode formed according to the inventive method and the internal electrode having an end and a portion close thereto which were electrochemically dissolved/removed respectively.
Figure 10B:
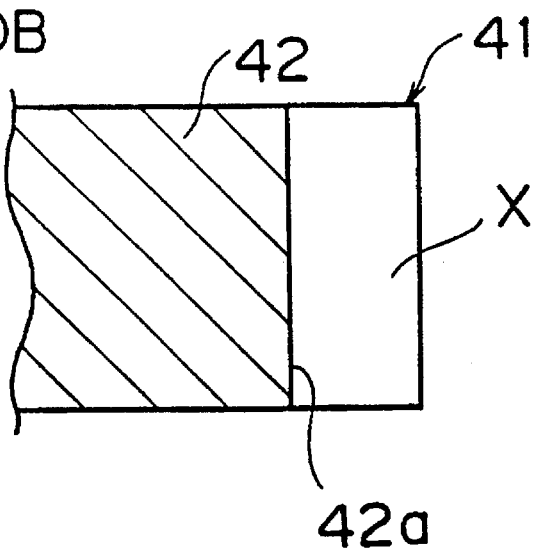

In the manufacturing method according to this Example, on the other hand, an internal electrode 42 is densely and correctly formed in a certain vertical position of a sintered body 41 by a thin film forming method, as shown in FIG. 10A. When a gap region 43 is formed by the aforementioned electrochemical etching, therefore, an edge 42a of the internal electrode 42 has sufficient smoothness, as shown in FIG. 10B.

In the method of manufacturing the multilayer piezoelectric actuator 21 according to this Example, as hereinabove described, the clearances A and C for defining the gap regions are formed by electrochemical etching, whereby it is possible to form gap regions having extremely small widths of 15 μm in high accuracy. Further, the internal electrodes 2 to 7 are formed by vapor deposition so that forward end portions of these internal electrodes 2 to 7 facing the clearances A and C are maintained in smooth states, whereby electric field concentration hardly takes place in the insulating layers 12 to 17 even if the insulating layers 12 to 17 are formed in the gap regions of 15 μm in width.

Further, the present inventors performed experiments by varying the width of the gap region in a variety range in the monolithic piezoelectric actuator 21. As a result, if and when the width was narrower than 5 μm, the concentration of the electric field was liable to occur, and thus it was confirmed that the width of the gap region should be not less than 5 μm.

In case of fluctuating the inner edges of the inner electrodes from the designed value, if the fluctuation is over ±5 μm, the insulative break-down between the inner electrode and the opposite outer electrode was liable to occur. Thus, it was confirmed that the inner edge of the inner electrode should be located in the fluctuation of ±5 μm from the designed value of the inner electrode location.

SECOND EXAMPLE

Ceramic powder mainly composed of $BaTiO_3$ was dispersed in a solvent with an organic binder, to obtain ceramic slurry. This slurry was employed to prepare ceramic green sheets having uniform thicknesses of 10 μm. Internal electrodes of silver were formed on single major surfaces of the ceramic green sheets by vapor deposition, and thereafter the ceramic green sheets were punched into 60 mm by 40 mm in size.

The ceramic green sheets provided with the internal electrodes on the single major surfaces in the aforementioned manner were stacked with a plurality of ceramic green sheets provided with no internal electrodes and compressed along the thicknesses, to obtain a laminate. This laminate was fired to obtain a sintered body.

The sintered body as obtained was cut into a rectangular plane shape of 1.0 mm by 1.5 mm.

Except that the sintered body obtained in the aforementioned manner was employed, steps absolutely identical to those of first Example were carried out to finally obtain a multilayer capacitor which was provided with external electrodes on opposite side surfaces of the sintered body respectively.

Also in the method of manufacturing a multilayer capacitor according to this Example, it is possible to form extremely narrow gap regions of 15 μm in width in high accuracy since the gap regions are formed by electrochemical etching. Further, the internal electrodes are formed by vapor deposition of silver, whereby continuity of the electrode material in the internal electrodes is improved and hence smoothness in internal electrode edge portions removed by the electrochemical etching is also improved. Thus, abnormal electric field concentration hardly takes place in an insulating material which is filled up in clearances after the etching.

While the clearances defined by etching were filled up with fine powder of Pb—Si—Al glass by electrophoresis and heat treated to form insulating layers in each of first and second Examples, the step of filling up the insulating material can alternatively be carried out with another material and another method. For example, the insulating material may be prepared from glass other than the above, or synthetic resin or insulating ceramics. Further, the step of filling up the insulating material can be carried out by a proper method in response to the insulating material as employed, such as a method of filling up synthetic resin which is in a melted state and hardening the same, or a method of filling up the clearances with paste which is prepared by kneading insulating ceramic powder with a binder and carrying out heat treatment.

While first and second Examples were applied to manufacturing of a multilayer piezoelectric actuator and a multilayer capacitor respectively, the method of manufacturing a multilayer ceramic electronic component according to the present invention is also widely applicable to manufacturing of other multilayer ceramic electronic components such as a composite part including a multilayer capacitor, a multilayer piezoelectric resonance component and the like.

While a plurality of internal electrodes were finally alternately exposed on the opposite side surfaces of the sintered body along the thicknesses in each of first and second Examples, the multilayer ceramic electronic component to which the method of manufacturing a multilayer ceramic electronic component according to the present invention is applied is not restricted to such a structure. The present invention is also applicable to a multilayer ceramic electronic component comprising a plurality of internal electrode groups, each formed by a plurality of internal electrodes, which are alternately exposed on a pair of opposite side surfaces along thicknesses, such as a multilayer capacitor formed by a plurality of internal electrode groups each formed by two internal electrodes which are separated from each other through a ceramic layer.

Although in the first and second embodiments, the metal films are directly formed on the ceramic green sheets by the thin film forming method to obtain the above described laminate, the laminate may be formed by a transfer method in the present invention. Such an example will be described with reference to FIGS. 11A to 12D.

Figure 11A:
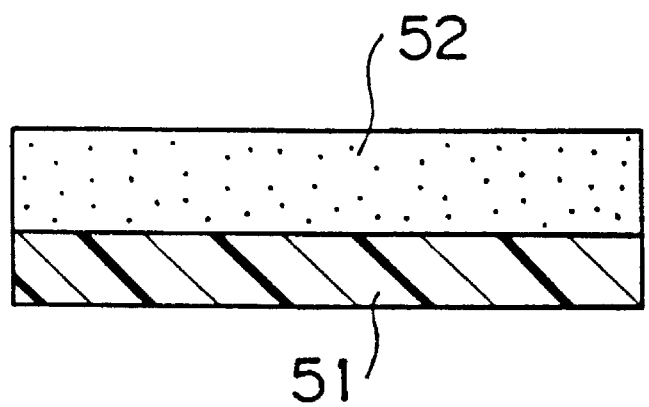
FIGS. 11A and 11B are diagrams for respectively explaining another method of obtaining a laminate, where
Figure 11B:
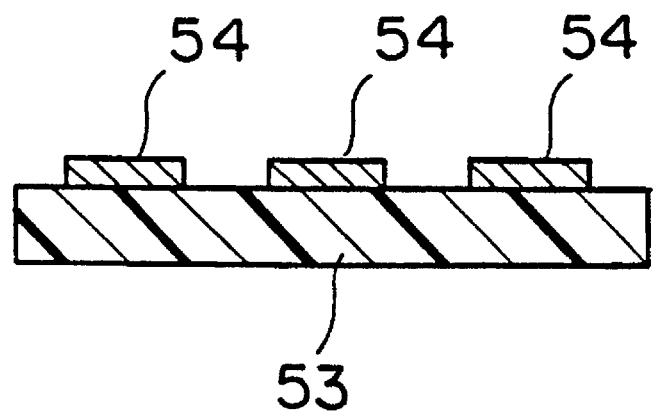

A ceramic green sheet 52 is first formed on a first supporting film 51 by the Doctor blade method or the like, as shown in FIG. 11A. On the other hand, a plurality of metal films 54 are formed on a second supporting film 53 by a thin film forming method, as shown in FIG. 11B. The plurality of metal films 54 can be obtained by forming a metal film on the entire one surface of the second supporting film 53 by the thin film forming method and then, patterning the same. Alternately, the plurality of metal films 54 can be also formed by the thin film forming method in a state where a mask is superimposed on the second supporting film 53.

Figure 12A:
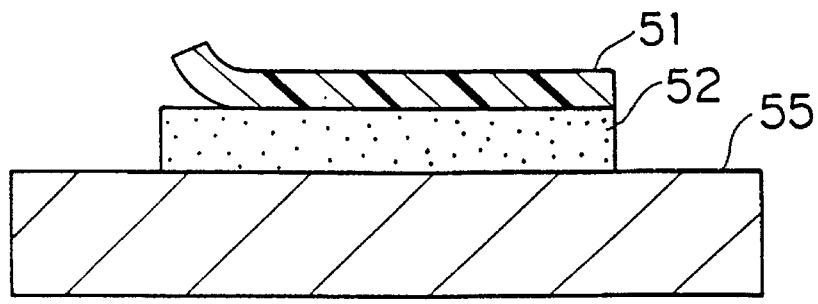
FIGS. 12A and 12D are sectional views respectively showing the steps of transferring the ceramic green sheet and the metal films shown in FIGS. 11A and 11B from the first and second supporting films to obtain a laminate.
Figure 12B:
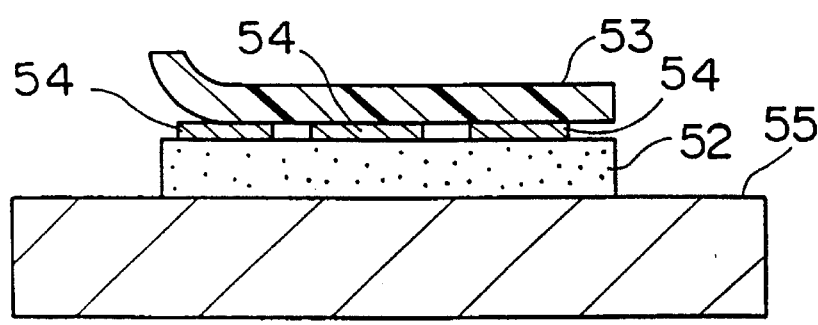
Figure 12C:
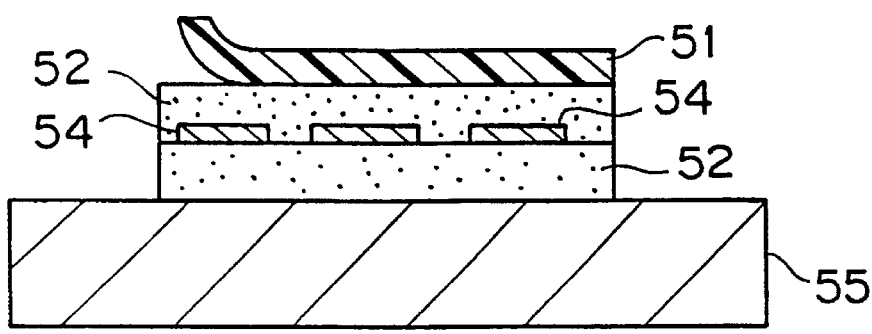

The above described ceramic green sheet 52 is then pressed onto the upper surface of a stage 55, to strip the first supporting film 51, as shown in FIG. 12A. The plurality of metal films 54 supported on the second supporting film 53 are then pressed onto the ceramic green sheet 52, as shown in FIG. 12B. Thereafter, the second supporting film 53 is stripped. In addition, the ceramic green sheet 52 supported on the first supporting film 51 is pressed onto the ceramic green sheet 52 previously stacked with the metal films 54 embedded in the ceramic green sheet 52. The first supporting film 51 is then stripped.

Figure 12D:
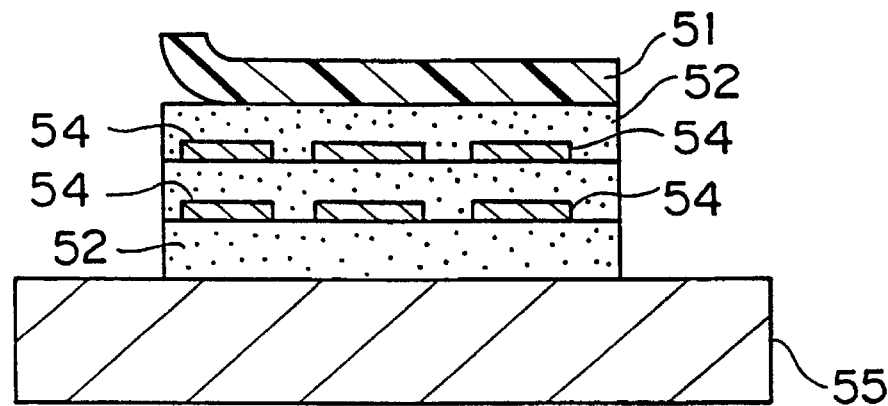

The above described steps of transferring and stacking the ceramic green sheet 52 and the metal films 54 are repeated, thereby to make it possible to obtain a laminate 56, as shown in FIG. 12D. The laminate 56 is a mother laminate. The laminate 56 is cut in its thickness, thereby to obtain a ceramic laminate for each multilayer capacitor.

Further, the present invention is also applicable to a laminate which is in an unfired state, as a matter of course.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a multilayer ceramic electronic component, comprising:

a step of preparing ceramic green sheets and metal films formed by a thin film forming method, a step of preparing a laminate having a portion in which said ceramic green sheets and internal electrodes consisting of said metal films formed by the thin film forming method are alternately stacked and having at least a pair of opposite side surfaces to which said internal electrodes are exposed, a step of electrochemically etching those of said internal electrodes not to be finally exposed on said pair of opposite side surfaces of said laminate on said opposite side surfaces for dissolving/removing exposed portions of said internal electrodes and portions close thereto;

a step of filling up said dissolved/removed portions of said internal electrodes with an insulating material; and a step of forming external electrodes on said pair of opposite side surfaces of said laminate respectively.

2. The method of manufacturing a multilayer ceramic electronic component in accordance with claim 1, wherein said metal films are formed on said ceramic green sheets by the thin film forming method.

3. The method of manufacturing a multilayer ceramic electronic component in accordance with claim 2, wherein a plurality of ceramic green sheets having said metal films formed thereon are stacked, thereby to obtain said laminate.

4. The method of manufacturing a multilayer ceramic electronic component in accordance with claim 1, wherein said ceramic green sheet is formed on a first supporting film, and said metal film is formed on a second supporting film and the ceramic green sheet on said first supporting film and the metal film on the second supporting film are alternately transferred from the first and second supporting films, thereby to obtain said laminate.

5. The method of manufacturing a multilayer ceramic electronic component in accordance with claim 1, wherein said thin film forming method is carried out by vapor deposition.

6. The method of manufacturing a multilayer ceramic electronic component in accordance with claim 1, wherein said thin film forming method is carried out by sputtering.

7. The method of manufacturing a multilayer ceramic electronic component in accordance with claim 1, wherein said thin film forming method is carried out by plating.

8. The method of manufacturing a multilayer ceramic electronic component in accordance with claim 1, wherein said step of electrochemically etching the internal electrodes is carried out in a state where the laminate is dipped in an acid aqueous solution.

9. The method of manufacturing a multilayer ceramic electronic component in accordance with claim 1, wherein said step of filling up said dissolved/removed portions of said internal electrodes with an insulating material is carried out by employing glass as the insulating material and filling up the dissolved/removed portions of the internal electrodes with the glass by electrophoresis.

10. The method of manufacturing a multilayer ceramic electronic component in accordance with claim 1, wherein said multilayer ceramic electronic component is a multilayer capacitor.

11. The method of manufacturing a multilayer ceramic electronic component in accordance with claim 1, wherein said multilayer ceramic electronic component is a mutilayer piezoelectric actuator.

12. A monolithic ceramic electric component comprising a sintered body wherein ceramic layers and inner electrodes each made of a metal layer formed by a thin film forming method are alternatively stacked; and first and second outer electrodes formed on side surfaces of the sintered body and electrically connected to inner electrodes, an insulating layer being formed between an inner end of the inner electrode connected with the first or second outer electrode and the second or first outer electrode, and the edge of the inner end of the inner electrode existing in a range of ±5 μm in the direction of the inner electrode surface from an intended or designed location.

13. A monolithic ceramic electric component in accordance with claim 12, wherein the distance between the inner end of the inner electrode and the outer electrode formed on the opposite side is within a range of 5 μm to 70 μm.

14. A monolithic ceramic electric component in accordance with claim 12, wherein a plurality of the inner electrodes are alternatively connected in the thickness direction with the first or second outer electrode, and the ceramic layer is formed by the piezoelectric ceramics.

15. A monolithic ceramic electric component in accordance with claim 12, wherein the ceramic layer is made of dielectric ceramics.

\* \* \* \* \*